United States Patent [19]

Hayakawa et al.

[11] Patent Number: 4,845,724
[45] Date of Patent: Jul. 4, 1989

[54] SEMICONDUCTOR LASER DEVICE HAVING OPTICAL GUILDING LAYERS OF UNEQUAL RESISTANCE

[75] Inventors: Toshiro Hayakawa, Nara; Takahiro Suyama, Tenri; Kosei Takahashi, Tenri; Masafumi Kondo, Tenri, all of Japan

[73] Assignee: 501 Sharp Kabushiki Kaisha, Osaka, Japan

[21] Appl. No.: 136,671

[22] Filed: Dec. 22, 1987

[30] Foreign Application Priority Data

Dec. 26, 1986 [JP] Japan ................. 61-314275

[51] Int. Cl.$^4$ .............................. H01S 3/19
[52] U.S. Cl. ........................... 372/45; 372/46
[58] Field of Search ................ 372/44, 45, 46

[56] References Cited

U.S. PATENT DOCUMENTS 4,480,331 10/1984 Thompson ............................ 372/45
4,631,802 12/1986 Hayashi et al. ................. 372/45 X
4,757,510 6/1988 Kaneno et al. ..................... 372/45

FOREIGN PATENT DOCUMENTS 12100501A 12/1982 United Kingdom .

OTHER PUBLICATIONS

NEC Corp, Patent Abstracts of Japan 10(259), E-434, 2315.
Fujii et al., (1985) Fujitsu Scientific & Technical Journal 21(4):421–426.
Shotov et al., (1986) Soviet Technical Physics Letters 12(11):574–575.
Wada et al., (1985) Electronics Letters 21(22):025–1026.
Okajima et al., (1981) Japanese Journal of Applied Physics 21:353–358.

*Primary Examiner*—James W. Davie
*Attorney, Agent, or Firm*—Irell & Manella

[57] ABSTRACT

A semiconductor laser device comprising a double-heterostructure that is composed of an active layer and a pair of cladding layers sandwiching the active layer therebetween, a striped structure in which current injected into the laser device is confined, the striped structure being constituted by a part of the double-heterostructure, and optical guiding layers positioned between one cladding layer and the active layer and between the active layer and the other cladding layer, wherein the resistance of one optical guiding layer positioned at the striped structure side is higher than that of the other optical guiding layer positioned opposite to the striped structure side.

4 Claims, 1 Drawing Sheet

SEMICONDUCTOR LASER DEVICE HAVING OPTICAL GUILDING LAYERS OF UNEQUAL RESISTANCE

BACKGROUND OF THE INVENTION

1. Field of the Invention

This invention relates to a semiconductor laser device that attains laser oscillation at an extremely low threshold current level.

2. Description of the Prior Art

Conventional semiconductor laser devices are classified into two groups, gain-guided semiconductor laser devices and index guided semiconductor laser devices, according to their optical waveguiding mechanism. Index guided semiconductor laser devices are superior to gain-guided semiconductor laser devices in view of transverse mode stabilization that is important in practical use. Index guided semiconductor laser devices having a variety of structures have been proposed, in which light and current are confined within a narrow excitation region, so that the threshold current level for laser oscillation can be reduced. Typical examples of such laser devices that attain a low threshold current level are buried heterostructure (BH) laser devices and ridge-waveguide laser devices.

FIG. 2 shows a buried heterostructure laser device, which is produced as follows:

A double-heterostructure, in which an active layer 3 for laser oscillation is sandwiched between a pair of cladding layers 2 and 4 is formed on a substrate 1, and then a cap layer 5 is formed, followed by etching to form a striped mesa. The area outside of the mesa is buried with a material 14 having a low refractive index, resulting in a waveguide with a width w of as narrow as about 2 μm so that a fundamental transverse mode oscillation can be achieved at a low threshold current level at about 10 mA or less. In order to effectively confine current within the mesa region that is essential to laser oscillation, the burying layer 14 must be constituted by a high resistive layer or by a multi-layer having a pn junction that is reverse to that of the mesa region.

However, since the burying layer 14 is grown after the formation of the mesa region, an energy level arises at the interface between the burying layer 14 and the mesa region, which causes ineffective current of about 2–10 mA that flows through the said interface without passing through the active region. The proportion of the ineffective current to a total amount of current increases with a decrease in the width w of the waveguide, which causes a limitation of the lowering of the threshold current level of the laster device.

FIG. 3 shows a ridge-waveguide laser device, which is produced as follows:

A double-heterostructure where an active layer 3 is sandwiched between the n- and p-cladding layers 2 and 4 is formed on a substrate 1, and then a cap layer 5 is formed, followed by etching to remove portions that reach the p-cladding layer 4 positioned above the active layer 3, resulting in a striped mesa, so that the effective refractive-index of the portion of the p-cladding layer 4 other than the mesa becomes lower than that of the mesa. The ridge-waveguide laser device is different from the BH laser device in that the entire area of the active layer 3 remains without being etched, and accordingly current injected into the ridge-waveguide laser device flows through the active layer 3. However, since a part of the p-cladding layer 4 of the ridge-waveguide laser device exists outside of the mesa, current injected into the ridge-waveguide laser device diffuses from the mesa of the p-cladding layer 4 into the portion of the p-cladding layer 4 other than the mesa, as indicated by arrow marks in FIG. 3. An amount of current, which flows into a portion other than the portion of the active layer 3 positioned below the mesa within which laser light is confined, becomes ineffective current, causing an increase in the threshold current level of the ridge-waveguide laser device.

SUMMARY OF THE INVENTION

The semiconductor laser device of this invention, which overcomes the above-discussed and numerous other disadvantages and deficiencies of the prior art, comprises a double-heterostructure that is composed of an active layer and a pair of cladding layers sandwiching said active layer therebetween, a striped structure in which current injected into said laser device is confined, said striped structure being constituted by a part of said double-heterostructure, and optical guiding layers positioned between one cladding layer and said active layer and between said active layer and the other cladding layer, wherein the resistance of one optical guiding layer positioned at the striped structure side is higher than that of the other optical guiding layer positioned opposite to the striped structure side.

In a preferred embodiment, the striped structure is formed into a mesa or a ridge.

In a preferred embodiment, the thickness of a portion of the cladding layer outside of the striped structure, which is positioned at the striped structure, is 500 Å or less.

Thus, the invention described herein makes possible the objectives of (1) providing a semiconductor laser device with a ridge-waveguide type current path or the like in which the diffusion of current injected into the said laser device in the transverse direction is suppressed so that ineffective current that does not contribute to laser oscillation becomes minimal, thereby attaining the lowering of the threshold current level of the said laser device, and (2) providing a semiconductor laser device in which since an unetched active layer is used and an energy level does not arise at the interface between the active layer and the burying layer, a high yield of the said laser device and a high reliability can be attained, which is useful in practical applications.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a semiconductor laser device in which a first optical guiding layer is disposed between the first cladding layer and the active layer and a second optical guiding layer positioned at a striped region for confining current therein is disposed between the active layer and the second cladding layer, resulting in a separate confinement heterostructure, and moreover than resistance of the second optical layer is lower than that of the first optical layer.

EXAMPLE 1

Figure 1:
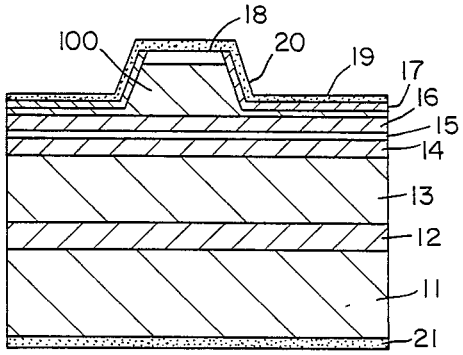
FIG. 1 is a front sectional view showing a semiconductor laser device of this invention.
Figure 2:
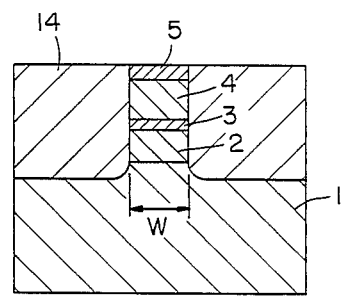
FIG. 2 is a front sectional view showing a conventional BH laser device.
Figure 3:
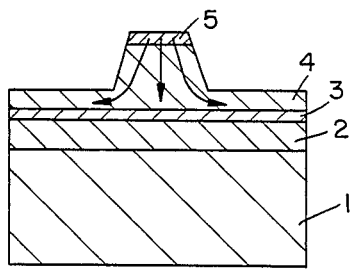
FIG. 3 is a front sectional view showing a conventional ridge-waveguide laser device.

FIG. 1 shows a semiconductor laser device, which is produced as follows:

On an n-GaAs substrate ($Si=2\times 10^{18} cm^{-3}$)11, an n-GaAs buffer layer ($Si=2\times 10^{18} cm^{-3}$; the thickness thereof being 0.5 $\mu m$)12, an n-$Al_{0.7}Ga_{0.3}As$ cladding layer ($Si=2\times 10^{18} cm^{-3}$; the thickness thereof being 1.4 $\mu m$)13, an n-$Al_xGa_{1-x}As$ GRIN (gradedindex) layer ($Si=5\times 10^{17} cm^{-3}$; the thickness thereof being 0.2 $\mu m$)14, an undoped GaAs quantum well active layer (the thickness thereof being 60 Å) 15, an unintentionally doped $Al_xGa_{1-x}As$ . GRIN layer ($p\sim 0^{15} cm^{-3}$; the thickness thereof being 0.2 $\mu m$)16, a p-$Al_{0.7}Ga_{0.3}As$ cladding layer ($Be=5\times 10^{17} cm^{-3}$; the thickness thereof being 1.4 $\mu m$)17, and a p-GaAs cap layer ($Be=5\times 10^{18} cm^{-3}$; the thickness thereof being 0.5 $\mu m$)18 are successively grown by molecular beam epitaxy. The AlAs mole fraction x of the GRIN layers 14 and 16 increases parabolically in the range of 0.2 to 0.7 with distance toward the cladding layers 13 and 17 from the quantum well active layer 15. The GRIN layers 14 and 16 function as an optical guiding layer. The unintentionally doped AlGaAs layer 16 that is grown by molecular beam epitaxy is of a p type with $p\sim 10^{15} cm^{-3}$ due to the residual carbon impurities.

Then, the wafer is etched by a reactive ion beam etching teaching using $Cl_2$ gas in such a manner that the etched portion reaches the p-cladding layer 17, resulting in a striped mesa 100. The thickness of the portion of the p-cladding layer 17 outside of the striped mesa 100 is 500 Å or less. Then, a SiNx film 19 is formed by plasma assisted chemical vapor deposition on the wafer other than the cap layer 18. A p-sided electrode 20 of AuZn/Au and an n-sided electrode 21 of AuGe/Ni/Au are formed on the upper face of the SiNx film 19 including the cap layer 18 and the back face of the substrate 11, respectively, resulting in a semiconductor laser device. When the width of the lower portion of the striped mesa and the cavity length of the semiconductor laser device was 3.5 $\mu m$ and 250 $\mu m$, respectively, the semiconductor laser device attained laser oscillation with an oscillation wavelength of 840 nm at a threshold current of 4 mA.

Since the semiconductor laser device is designed so that the GRIN layer 16 having a relatively high resistance ($p<1\times 10^{15} cm^{-3}$) is positioned above the active layer 15, and moreover the GRIN layer 14 and the AlGaAs cladding layer 13, both of which have a resistance lower than that of the GRIN layer 16, are positioned below the active layer 15, the diffusion of current that is injected into the active layer 15 through the striped mesa 100 can be effectively suppressed.

Thus, a quantum well semiconductor laser device with the above-mentioned GRIN-SCH structure can achieve laser oscillation at a low threshold current level.

EXAMPLE 2

Figure 4:
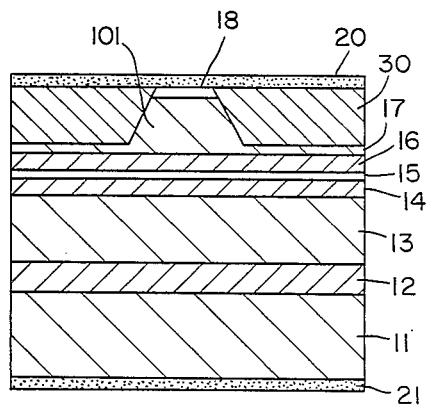
FIG. 4 is a front sectional view showing another semiconductor laser device of this invention.

FIG. 4 shows another semiconductor laser device of this invention, which is produced as follows:

A multi-layered structure having an active layer 15 that is defined by a double-heterostructure is formed on an n-GaAs substrate 11 by molecular beam epitaxy in the same way as that shown in FIG. 1. Then, a striped ridge 101 is formed by the use of a $SiO_2$ film (not shown) that functions as a mask, and on the wafer except for the top surface of the cap layer 18 of the ridge 101, an n-GaAs current blocking layer ($Si=2\times 10^{18} cm^{-3}$; the thickness thereof being 2 $\mu m$) 30 is grown. Then, the $SiO_2$ film is removed, followed by the formation of a p-sided electrode 20 of AuZn/Au and an n-sided electrode 21 of AuGe/Ni/Au on the upper face of the current blocking layer 30 including the cap layer 18 and the back face of the substrate 11, respectively, resulting in a ridge-waveguide semiconductor laser device. When the width of the lower portion of the striped ridge 101 and the cavity length of the said semiconductor laser device were set to be 4 $\mu m$ and 250 $\mu m$, respectively, the semiconductor laser device attained laser oscillation with an oscillation wavelength of 840 nm at a threshold current level of 8 mA. Since this semiconductor laser device is designed so that the thickness of the portion of the p-cladding layer 17 other than the striped ridge 101 is as thin as 500 Å or less, the diffusion of current can be effectively suppressed, as well. In this example, light is absorbed by the n-GaAs layer 30, thereby attaining the stabilization of a transverse mode, and accordingly laser oscillation is achieved in a fundamental transverse mode when the width of the striped ridge 101 of the semiconductor laser device is set to be about 5 $\mu m$ at the maximum. However, loss of the light-absorption arises to a great extent in the semiconductor laser device, so that the threshold current level at which laser oscillation is attained by the said laser device becomes higher than that of the laser device of Example 1 shown in FIG. 1.

Although the above-mentioned two examples disclose that the optical guiding layer 14 positioned at the n-cladding layer side is doped with an Si dopant in a concentration of $5\times 10^{17} cm^{-3}$ (i.e., $Si=5\times 10^{17} cm^{-3}$) and the optical guiding layer 16 positioned at the p-cladding layer side is unintentionally doped to be of a p-type with $p\sim 10^{15} cm^{-3}$, the carrier concentration of the n-sided optical guiding layer can be set to be $10^{17} cm^{-3}$ or more and the carrier concentration of the p-sided optical guiding layer can be set to be $10^{16} cm^{-3}$ or less, so that the resistance of the p-sided optical guiding layer becomes higher than that of the n-sided optical guiding layer and the diffusion of current in the transverse direction that is injected into the active layer through the striped mesa or ridge can be suppressed. Si, Te, Se, etc., can be used as an n-type dopant of each layer and Be, Zn, Mg, etc., can be used as a p-type dopant of each layer.

Moreover, by the molecular beam epitaxy attaining the growth of layers with a high crystal purity such as that used in the above-mentioned examples, notwithstanding that the growth layers are not doped with dopants, a p-type growth layer with $p\sim 10^{16} cm^{-3}$ can be obtained. Even when other crystal layer growth techniques such as liquid phase epitaxy, etc., are used, if n- or p-type growth layers with $n\sim 10^{16} cm^{-3}$ or $p\sim 10^{16} cm^{-3}$ are obtained notwithstanding that the said growth layers are not doped with dopants, undoped optical guiding layers can be used as demanded.

Moreover, the p-sided optical guiding layer can be of an n-type with $n\leq 10^{17} cm^{-3}$. Since positive holes injected into the said n-optical guiding layer are a small amount of carrier, the extent of the diffusion of carrier is limited to as short as 1 μm or less so that the diffusion of current can be effectively suppressed. In addition, when the carrier concentration is $1 \times 10^{17}$ cm$^{-3}$ or less, the radiative recombination in the optical guiding layer is smaller than that in the active layer, and accordingly loss of the carrier injected as a remote junction does not become great.

This invention is not limited to the laser device structure disclosed in the above-metnioned examples, any structure in which the portion of the pcladding layer outside of the oscillating area is thinned to a thickness of 500 Å or less or removed and a current blocking function is achieved can be applied to this invention; for example, the current blocking layer 30 of the laser device shown in FIG. 4 can be made of a semi-insulating material such as GaAs, AlGaAs or the like or an insulating material such as polyimide resin.

Although the above-mentioned examples disclose a quantum well structure with the active layer the thickness of which is 60 Å, a growth layer having a thickness of several hundreds of angstrom to about 2000 Å can be formed as an active layer by liquid phase epitaxy, metal organic-chemical vapor deposition, etc. Moreover, the optical guiding layers are not necessarily GRIN layers, but they can be growth layers with a certain composition or can be GRIN layers the composition of which varies according to a distribution other than the parabolic distribution. The semiconductor laser device of this invention is not limited to the AlGaAs system, but is applicable to other semiconductor materials such as the InGaAsP system, the InAlGaP system, the AlGaAsSb system, the InGaAlAs system, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device, the device comprising:
    a double-heterostructure that is composed of an active layer and a pair of cladding layers sandwiching said active layer therebetween,
    a striped structure in which current injected into said laser device is confined, said striped structure being constituted by a part of said double-heterostructure, and
    optical guiding layers positioned between one cladding layer and said active layer and between said active layer and the other cladding layer, wherein the resistance of one optical guiding layer positioned at the striped structure side is higher than that of the other optical guiding layer positioned opposite to the striped structure side.

2. A semiconductor laser device according to claim 1, wherein said striped structure is formed into a mesa.

3. A semiconductor laser device according to claim 1, wherein said striped structure is formed into a ridge.

4. A semiconductor laser device according to claim 1, wherein the thickness of a portion of the cladding layer outside of the striped structure, which is positioned at the striped structure, is 500 Å or less.

* * * * *